US012791606B2

(12) United States Patent
Shi et al.

(10) Patent No.: US 12,791,606 B2

(45) Date of Patent: Nov. 10, 2026

(54) CURRENT DISTURBANCE DETECTION SYSTEM

(71) Applicant: SIGNIFY HOLDING B.V., Eindhoven (NL)

(72) Inventors: Liang Shi, Shanghai (CN); Kang Li, Shanghai (CN); Shan Wang, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 170 days.

(21) Appl. No.: 18/728,931

(22) PCT Filed: Sep. 22, 2022

(86) PCT No.: PCT/EP2022/076309

§ 371 (c)(1),
(2) Date: Jul. 15, 2024

(87) PCT Pub. No.: WO2023/134887

PCT Pub. Date: Jul. 20, 2023

(65) Prior Publication Data

US 2025/0093403 A1 Mar. 20, 2025

(30) Foreign Application Priority Data

Jan. 17, 2022 (WO) ................ PCT/CN2022/072399
Feb. 25, 2022 (EP) .................................... 22158824

(51) Int. Cl.
*G01R 31/28* (2006.01)
*G01R 15/18* (2006.01)
(Continued)

(52) U.S. Cl.
CPC ......... *G01R 31/2843* (2013.01); *G01R 15/18* (2013.01); *G01R 19/0092* (2013.01);
(Continued)

(58) Field of Classification Search
CPC ............... G01R 31/2843; G01R 15/18; G01R 19/0092; G01R 31/40; G01R 31/52;
(Continued)

(56) References Cited

U.S. PATENT DOCUMENTS 6,636,107 B2 * 10/2003 Pelly ....................... H02M 1/12 363/40
6,898,092 B2 * 5/2005 Briere ..................... H02M 1/44 363/39
(Continued)

FOREIGN PATENT DOCUMENTS

JP 2004135489 A 4/2004
JP 2013231720 A 11/2013
(Continued)

*Primary Examiner* — Sreeya Sreevatsa

(57) ABSTRACT

A driving circuit and arrangement for driving a load between two output terminals. The driving circuit comprises an input and output terminals connected to the input. A fault detection inductor is connected in series with the output terminals, and is configured to modify an electrical parameter through a feedback inductor responsive to a change in current between the output terminals. The feedback inductor is galvanically isolated, but magnetically coupled, to the fault detection inductor. The driving circuit further comprises a first current sensing inductor through which a current provided by the converter passes, and the feedback inductor is also galvanically isolated, but magnetically coupled, to first current sensing inductor. Thus the feedback inductor can be induced with signal both from the first current sensing inductor and the fault detection inductor and saves components, space, and cost.

19 Claims, 3 Drawing Sheets

(51) Int. Cl.

| | |
|---|---|
| ***G01R 19/00*** | (2006.01) |
| ***H02H 3/16*** | (2006.01) |
| ***H02M 1/00*** | (2007.01) |
| ***H02M 1/32*** | (2007.01) |
| ***H02M 3/335*** | (2006.01) |

(52) U.S. Cl.
CPC ............ *H02H 3/16* (2013.01); *H02M 1/0009* (2021.05); *H02M 1/32* (2013.01); *H02M 3/33571* (2021.05)

(58) Field of Classification Search
CPC ........ H02H 3/16; H02M 1/0009; H02M 1/32; H02M 3/33571
USPC .............................................. 361/931.1, 93.1
See application file for complete search history.

(56) References Cited

U.S. PATENT DOCUMENTS

2004/0012381 A1* 1/2004 Hachisuka ............. G01R 15/18 324/117 R
2005/0093553 A1 5/2005 Li
2006/0262466 A1 11/2006 Engel
2008/0080106 A1* 4/2008 Mirafzal ................. H02M 1/12 361/42
2011/0153234 A1* 6/2011 Winterhalter .......... G01R 31/42 702/58
2013/0293989 A1 11/2013 Shipley et al.
2015/0084510 A1 3/2015 Miura et al.
2018/0131287 A1* 5/2018 Cardu ................... H02M 1/083

FOREIGN PATENT DOCUMENTS

JP 2016539465 A 12/2016
WO 2021191067 A1 9/2021
WO 2021213811 A1 10/2021
WO 2021228669 A1 11/2021
WO 2021234070 A1 11/2021

* cited by examiner

CURRENT DISTURBANCE DETECTION SYSTEM

CROSS-REFERENCE TO PRIOR APPLICATIONS

This application is the U.S. National Phase application under 35 U.S.C. § 371 of International Application No. PCT/EP2022/076309, filed on Sep. 22, 2022, which claims the benefit of International Application No. PCT/CN2022/072399, filed on Jan. 17, 2022 and European Patent Application Ser. No. 22/158,824.7, filed on Feb. 25, 2022. These applications are hereby incorporated by reference herein.

FIELD OF THE INVENTION

The present invention relates to the field of drivers, and in particular, to approaches for monitoring current provided to a load by a driver.

BACKGROUND OF THE INVENTION

In the field of consumer and industrial electrical goods, there are a wide variety of driving arrangements that are available for driving a load.

It is common for these driving arrangements to comprise a converter that converts power (e.g. from a battery or mains power supply) and provides the converted power to the load via output terminals. If the load requires a DC current, then it is customary for an output capacitor to be provided between the output terminals, which stores and smooths a power supplied by the converter.

Appropriate control over the power provided to the load via the output terminals requires feedback. This is usually performed by monitoring the current provided to the output terminals, optionally with the output capacitor, to the load, to ensure it matches a desired current to be provided to the load. A traditional way of measuring the current to the load is having a current sensing resistor in series with the load. A disadvantage of such a solution is that the current sensing resistor always consumes power, resulting in power loss.

There is an ongoing desire to improve the monitoring of a current provided to a load.

US 20040012381A1 discloses an anomaly detection circuit with a current detection part based on magnetic flux.

SUMMARY OF THE INVENTION

A basic idea of the invention is to use an inductor, instead of a current sensing resistor, to sense a current through the load. More specifically, such an inductor is not used to measure normal operating current to the load, but is sized and/or positioned to respond to relatively more sudden and/or large change in the current to the load, caused by a fault with respect to the load and/or the load/output terminals. A wide variety of potential faults, such as an open circuit, a short circuit, or a bad connection, will cause a very sharp/large change in the current through the load and/or between the output terminals. This will, in turn, induce a large voltage change across the inductor. By analyzing such a voltage on the inductor, the occurrence of a fault can be determined. The inductor is coupled to a feedback inductor. A further idea of the invention is that the current sensing inductor used to sense for example the normal operating current provided by the rectifier for the load is also coupled with the feedback inductor, thus the feedback inductor can be induced with signal both from the current sensing inductor and the fault detection inductor. This integration of three windings/inductors saves components, space, and cost. In particular, use of a same feedback inductor to provide information from both a fault detection inductor and a current sensing inductor avoids the need for multiple feedback inductors.

The invention is defined by the claims.

According to examples in accordance with an aspect of the invention, there is provided a driving circuit for providing power generated by a converter to a load.

The driving circuit comprises: an input adapted to receive power from the converter; output terminals adapted to connect to a load for providing the received power to the load; a fault detection inductor electrically connected in series with the output terminals so that a current flow through the output terminals and the load passes through the fault detection inductor, such that a fault across the output terminals causes a change in the current flow through the fault detection inductor; a first current sensing inductor through which a current provided by the converter passes; a feedback inductor galvanically isolated from and magnetically coupled to the fault detection inductor and configured to modify an electrical parameter through the feedback inductor responsive to the change in the current flow through the fault detection inductor, also galvanically isolated from and magnetically coupled to the first current sensing inductor and is configured to modify an electrical signal through the feedback inductor responsive to a current flow through the first current sensing inductor via the electrical signal; a detector configured to detect the modification in the electrical parameter through the feedback inductor and generate a fault feedback signal responsive to the detected modified electrical parameter; and a current sensing circuit to sense current flowing through the first current sensing inductor via the electrical signal.

The proposed approach provides a fast response solution to sudden changes in current at the load or output terminals, such as those caused by a sudden short circuit, open circuit or other form of breakage or fault. The use of a feedback inductor connected between the output capacitor and the load facilitates detection of a sudden/large change in current through the load, to thereby facilitate identification of such a fault. The galvanically isolated feedback inductor provides galvanic isolation between the power loop and the control loop. This provides a reliable and fast-responsive system for identifying the occurrence of a fault. Additionally, a current sensing inductor is used to sense for example the normal operating current provided for the load. The feedback inductor is also coupled to the current sensing inductor, thus the feedback inductor can be induced with signal both from the current sensing inductor and the fault detection inductor. This integration of three windings saves components, space, and cost. In particular, use of a same feedback inductor to provide information from both a fault detection inductor and a current sensing inductor avoids the need for multiple feedback inductors.

The change in the current through the fault detection inductor may indicate a fault between the output terminals and the load, and/or in the load itself.

The driving circuit may further comprise an output capacitor connected in parallel with the output terminals and adapted to smooth the received power from the converter, wherein the fault detection inductor is electrically connected between the output capacitor and the output terminals.

In this embodiment, the inductor is placed after the output capacitor so that the inductor is more sensitive to the fault current at the load/load terminal, and the fault current will not be filtered out by the output capacitor. A fault current is a current (e.g., change) induced by a fault between the output terminals and/or in the load.

In some examples, the driving circuit further comprises a rectifier arrangement configured to rectify power provided by the converter and provide the rectified power to the output terminals, wherein the rectifier comprises a first rectifying path; the first current sensing inductor is positioned in the first rectifying path; the current sensing circuit to sense current flowing through the first current sensing inductor via the electrical signal, comprising; a filter configured to generate a filtered signal, being a filtered version of the current flow through the feedback inductor relating to the current flow through the first current sensing inductor and in which current component induced by the fault detection inductor is filtered or attenuated; and a current sensing detector for generating a current feedback signal responsive to the filtered signal.

A filter is used to effectively split the signal relating to the current feedback signal and the signal relating to the fault feedback signal. The filter may comprise an averaging circuit and/or a frequency selection circuit. An average circuit will average any electrical signal provided to the filter (e.g. average a voltage using a capacitor), thus the large but short fault signal will be filtered out and the remaining signal is accurately the rectifier's output current. A frequency selection circuit will select a particular frequency and/or frequency range, and attenuate other frequencies, thus the transient fault signal will be filtered out and the remaining signal is accurately the rectifier's output current.

The above rectifier can either be a half wave rectifier if it only has the above first rectifying path, or, in a further embodiment, be a full wave rectifier wherein the rectifier further comprises a second rectifying path. In such an embodiment, the driving circuit may further comprise a second current sensing inductor positioned in the second rectifying path; the feedback inductor is galvanically isolated from and magnetically coupled to the second current sensing inductor and is configured to modify the electrical signal through the feedback inductor responsive to the current flow through the second current sensing inductor, and the current sensing circuit is also adapted to sense the current flowing through the second current sensing inductor via the electrical signal. Such an embodiment is particularly useful if the rectified currents in two phases are not systematical thus the first and second current sensing inductors are used for measuring them respectively.

The current sensing circuit may comprise a rectifying circuit coupled between the feedback inductor and the filter.

This rectifying circuit provides a single phased signal for the filter therefore it is easier for the filter and downstream circuits to process it.

In at least one example, the fault comprises any one of: a short circuit, an open circuit, or a loose connection of the output terminals and/or the load.

Those faults would cause a sudden/large change in the current through the fault detection inductor thus modifying the electrical parameter in the feedback inductor. The embodiment of the invention is capable of detecting those faults and provides reliability for the driving circuit.

The driving circuit may further comprise a signal processing circuit configured to process the fault feedback signal to determine the presence or absence of the fault.

In some examples, the feedback inductor is configured to modify the electrical parameter responsive to a current flow through the fault detection inductor greater than 150% of a rated normal output current of the driving circuit. In particular examples, the feedback inductor may be configured to modify the electrical parameter responsive to a change in current flow through the fault detection inductor.

The detector may comprise a resistive element connected between a positive terminal of the feedback inductor and a ground or reference voltage.

There is also proposed a driving arrangement comprising: the driving circuit as herein described; and the converter configured to provide power to the driving circuit.

In at least one example, the converter is an isolated converter with a primary side winding and a secondary side winding galvanically isolated from and magnetically coupled to the primary side winding, wherein the driving circuit is connected to the secondary side winding. The driving circuit which is galvanically isolated is quite suitable for such isolated converter structure, wherein an isolation is inherently obtained between the feedback inductor and the secondary side winding, In some examples, the converter comprises an LLC and/or an LCC converting arrangement.

In some examples, the converter comprises a controller electrically connected to the primary side winding and the feedback winding, and configured to control the power provided to the driving circuit via the second winding responsive to at least the fault feedback signal.

In this embodiment, the feedback winding can electrically connect to the primary side controller for providing the signal thereto conveniently meeting the isolation regulation.

In some examples, the controller is configured to make the driving arrangement enter a protection mode, in which no power is supplied to the driving circuit, responsive to the fault feedback signal indicating that there is the fault.

Optionally, the controller is configured to make the driving arrangement operate in a drive mode, and regulate the power supplied to the driving circuit responsive to the current feedback signal.

The controller can have several different pins: a fault input pin connected to the non-filtered signal including the fault feedback signal and a normal current sense pin connected to the filtered signal which is the current feedback signal without the fault feedback signal. The controller acts or operates according to a respective signal received at a respective pin.

In at least one example, when operating in the drive mode, the controller is configured to regulate the current provided to the driving circuit to meet a reference current by monitoring the current feedback signal with respect to a target.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
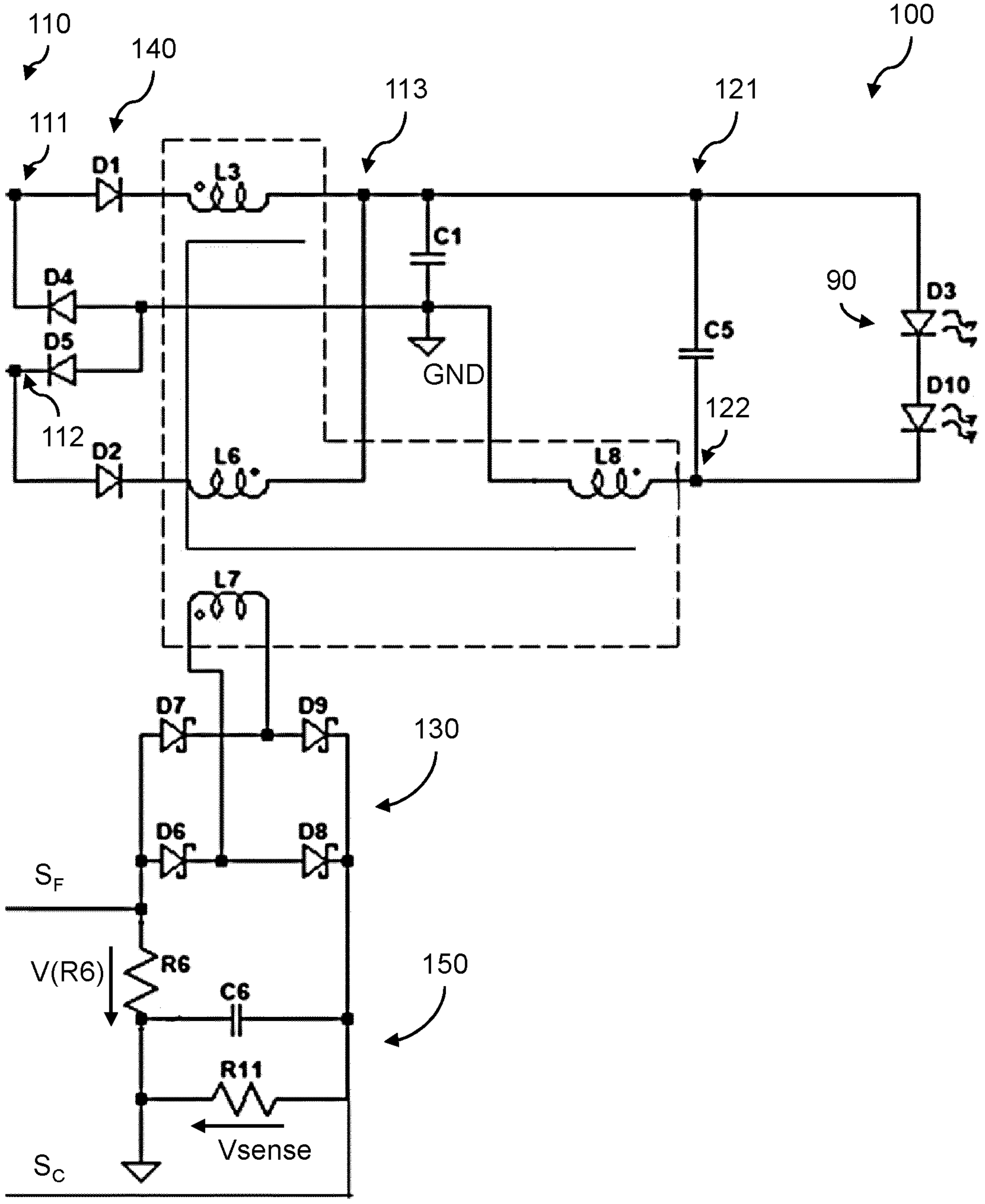
FIG. 1 illustrates a driver circuit according to an embodiment.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a driving circuit and arrangement for driving a load between two output terminals. The driving circuit comprises an input and output terminals connected to the input. A fault detection inductor is connected in series with the output terminals, and is configured to modify an electrical parameter through a feedback inductor responsive to a change in current between the output terminals. The feedback inductor is galvanically isolated, but magnetically coupled, to the fault detection inductor.

In any described embodiment, the term “terminal” is considered interchangeable with the term “node”, and refers to a piece of wiring or a point in a circuit. The term “current” refers to an electrical current.

FIG. 1 is a circuit diagram illustrating a driving circuit 100 according to an embodiment. The driving circuit 100 is configured for providing power generated by a converter (not shown) to a load 90. In the illustrated example, the load 90 comprises a first light emitting diode D3 and a second light emitting diode D10 connected in series, however, these components may be replaced by any other suitable load for a driving circuit. The capacitor C5 is an EMI capacitor, i.e. acts to attenuate any current induced by electromagnetic interference (EMI). Please note that this capacitor C5 is optional.

The driving circuit 100 comprises an input 110 adapted to receive power from the converter. Here, the input 110 comprises a first input terminal 111 and a second input terminal 112 configured to connect to the converter.

The driving circuit also comprises output terminals 121, 122 adapted to connect to a load for providing the received power to the load. Here, the output terminals comprise a first output terminal 121, connected to receive power from the input 110, and a second output terminal 122 connected to a ground or reference voltage GND. The first and second output terminals 122 are connected to either side of the load 90. Thus, current is able to flow from the input 110, to the first output terminal 121, through the load 90, to the second output terminal 122 and then to the ground or reference voltage.

Alternative appropriate configurations for an input 110 and output terminals 121, 122 would be apparent to the skilled person. For instance, an input 110 may comprise only a single node or terminal, e.g. terminal 113, for connecting to the converter.

The driving circuit 100 also comprises a fault detection inductor L8 (or winding) electrically connected in series with the output terminals. In the illustrated example, the fault detection inductor is connected in series between the second output terminal 122 and the ground or reference voltage GND. In an alternative example, the fault detection inductor could be connected between the input 110 and the first output terminal 121.

In this way, any current flow through the output terminals 121, 122 and the load 90 will also pass through the fault detection inductor L8. In normal operation, the current from the driving circuit to the load is smooth/stable and passes through, or is conducted by, the inductor L8 without causing a non-negligible voltage change. But, a fault across the output terminals 121, 122 will cause or induce a sudden/large change in the current flow through the fault detection inductor L8. The fault across the output terminals includes a short circuit or open circuit of the load 90 itself, of a bad connection at the output terminals 121 and 122. For example, when the load or the terminals suddenly become open, the current through the inductor L8 suddenly ceases and a negative voltage on the dotted/positive terminal will be introduced on the inductor L8; and when the load or terminals are short circuited, the current through the inductor L8 will rise (even though the inductor L8 would impede the rising) and a positive voltage on the dotted/positive terminal will be introduced on the inductor L8. It is noted that, when a large output buffer capacitor C1 (described later) is present, the fault will still cause a change in the current through the fault detection inductor L8 since the fault detection inductor is after the output buffer capacitor C1. But the inductors L3 and L6 (described later) will not endure such a change in the current due to that the buffer capacitor C1 somewhat filters out or attenuates the fault or the effects of the fault before the inductors L3 and L6.

The driving circuit 100 also comprises a feedback inductor L7 which is galvanically isolated from and magnetically coupled to the fault detection inductor L8. An electrical parameter through the feedback inductor will therefore change or be modified responsive to the above-mentioned sudden change in the current flow through the fault detection inductor L8. In particular, a change of current through the fault detection inductor (e.g. as a result of a fault) will result in a change in current through the feedback inductor L7.

This is the effect of Faraday’s law of induction, and would be readily apparent to the person skilled in the art. More particularly a change in current through the fault detection inductor will cause a magnetic field produced by the fault detection inductor to change. This change in the magnetic field will induce a change in the current flow (e.g., induce a current in) the magnetically coupled feedback inductor, resulting in a change in the electrical parameter, more specifically the current through the feedback inductor L7.

The driving circuit 100 also comprises a detector R6. The detector R6 detects the modification in the electrical parameter through the feedback inductor and generates a fault feedback signal $S_F$ responsive to the detected modified electrical parameter. In the illustrated example, the detector R6 comprises a resistive element (i.e., a resistor) connected between one pole/terminal (or both poles/terminals) of the feedback inductor L7 and a ground or reference voltage GND. Thus, a change in current through the feedback inductor will induce a sudden change voltage across the resistive element of the detector. The voltage V(R6) across the resistive element of the detector R6 can thereby act as the fault feedback signal $S_F$.

It is noted that the detector R6 does not comprise a capacitor in parallel with the resistive element. This avoids smoothing of a voltage across the resistive element, ensuring that the fault feedback signal $S_F$ will provide a noticeable spike or response to a fault in the load. If such a capacitor is provided, e.g. for EMI attenuation, the capacitance of a capacitor in parallel with the resistive element is preferably very small (e.g. <0.2 μF), to reduce the effect of low frequency filtering.

The fault feedback signal $S_F$ provides useful information on the state of the output terminals and/or the load, particularly whether a fault has occurred between the output terminals and/or in the load. This information can be used for a variety of purposes, e.g. to deactivate the driving circuit for improved safety or to otherwise control a current supplied to the driving circuit, e.g. by the converter.

For instance, a surge current between the output terminals 121, 122 (e.g. caused by a short circuit) will cause a current through the fault detection inductor L8 to spike. A surge current is a sudden change, e.g., an increase, in current between two points of a circuit. A surge current may, for instance, result from a switching on of the load or a part of the load, e.g. causing a load to suddenly begin drawing more power. A surge current could disadvantageously cause damage to the driving circuit. Use of a fault feedback signal $S_F$ to detect such an error would be advantageous for appropriately responding to a surge current.

The proposed approach provides a mechanism for accurate identification of faults between the output terminals, whilst keeping the fault identification mechanism galvanically isolated from the output terminals. This improves a safety of the driving circuit, e.g. reducing stray currents from reaching ground through a load connected between the output terminals, which may be an unintentional human connection.

FIG. 1 also illustrates an optional feature of the driving circuit 100, namely an output capacitor C1. The output capacitor C1 is connected in parallel with the output terminals 121, 122 and adapted to smooth the received power from the converter, i.e. the power receiving at the input 110. The output capacitor C1 thereby acts as an output buffer capacitor. In the specific illustrated example, the output capacitor is connected between the input 110 and the ground or reference voltage GND. Thus, the driving circuit comprises an output capacitor to store power received at the input 110 from the converter, and the output terminals are electrically connected to the output capacitor for providing power stored by the output capacitor to the load.

Use of an output capacitor C1 means that a near-DC current or voltage can be consistently provided to the output terminals 121, 122 and the load 90. The capacitance of the capacitor C1 is typically 22 μF, but may be in the region of 5 μF-50 μF, e.g. between 10 μF and 40 μF, e.g. 22 μF.

The fault detection inductor L8 may be electrically connected between the output capacitor C1 and the output terminals 121, 122. By connecting the fault detection inductor L8 between the output capacitor and the output terminals, the fault detection inductor L8 becomes highly sensitive to high frequency (from kHz to MHz) current changing. Such a current change might result from a fault, such as a (change to a) short circuit or open circuit, between the output terminals or in the load.

If the fault detection inductor were connected in front of the output capacitor (e.g. between the input 110 and the capacitor), the electrical current smoothing performed by the capacitor would mask or hide sudden changes due to a fault between the output terminals.

The illustrated driving circuit 100 further comprises the optional feature of a diode bridge 130, formed of a plurality of (e.g., Zener) diodes. This aids to isolate or decouple the feedback inductor L7 from other signals present in circuity connected to, or not galvanically isolated from, the feedback inductor. The diode bridge 130 also serves to make the fault feedback signal a single polarity signal, for improved ease and simplicity of identifying a fault. It is thus not important whether the fault resulted in a positive or negative change in an electrical parameter (e.g. across fault detection inductor L8), rather only that such a change has occurred. Anyway, if the driving circuit needs to know a type of the fault from the induced voltage on the fault feedback winding, the rectifier can be omitted and a polarity detection circuit can be added.

The illustrated driving circuit 100 further comprises the optional feature of a filter capacitor C5. The filter capacitor C5 is configured to filter extremely high frequency components from passing to the load. The filter capacitor C5 is connected in parallel with a load 90 connected to the output terminals 121, 122.

Further optional features of the driving circuit are hereafter described.

The driving circuit may comprise a rectifier arrangement 140, here formed of a diode bridge D1, D2, D4, D5. The rectifier arrangement 140 is configured to rectify power provided by the converter at the input 110. The rectified power is provided to the output terminals 121, 122. In some examples, if present, the output capacitor C1 may smooth or store the rectified power to be provided to the output terminals.

The rectifier arrangement 140 may be omitted, for instance, if similar or identical circuitry is formed in the converter itself, e.g. the converter provides rectified power to the input. In such examples, the input may comprise a single terminal, e.g. terminal 113, for connecting to the converter.

The rectifying arrangement comprises or defines a first rectifying path and a second rectifying path. Each rectifying path provides positive voltage/current to the output terminals and/or the output capacitor (if present). This is a full wave rectification. Those skilled in the art would understand that a half wave rectification is also possible and/or applicable wherein only one of the first rectifying path and a second rectifying path is needed and the other one removed/absent.

The driving circuit may comprise a first current sensing inductor L3 positioned in the first rectifying path. The feedback inductor L7 is galvanically isolated from and magnetically coupled to the first current sensing inductor L3. The feedback inductor L7 is configured to modify the electrical parameter, more specifically the current flow through the feedback inductor responsive to a current flow through the first current sensing inductor.

Optionally the magnetically coupled inductor L7 is responsive to a current flow through the first current sensing inductor or the fault detection inductor varying at a rate no less than 0.1 A/μs.

The driving circuit 100 may further comprise a current sensing circuit 150 to sense current flowing through the first current sensing inductor. The current sensing circuit 150 is a filter configured to generate a filtered signal Vsense, being a filtered version of the current flow through the feedback inductor relating to the current flow through the first current sensing inductor. In the filtered signal, Vsense, a current component induced in the feedback inductor by the fault detection inductor is filtered or attenuated.

The signal Vsense may represent the current feedback signal $S_C$.

Since the current component induced by the fault detection inductor when a fault occurs between the output terminals has a much higher amplitude than the signal related to the sensed current in the current sensing inductor, an averaging circuit as a filter is capable of distinguishing or separating the two signals. The illustrated filter 150 is an RC filter, formed of a resistor R11 and a capacitor C6 connected in parallel, between a node/arm of the feedback inductor L7 and a ground or reference voltage GND. The capacitance of the capacitor C6 may be 4.7 μF so as to effectively filter out high frequency noise and transient high signal (including the fault feedback signal). A voltage across the resistor R11 acts as the filtered signal Vsense. The filtered signal Vsense acts a current feedback signal, providing feedback about the current supplied to the driving circuit by the converter. This information can be used, for example, to control an operation of the converter to ensure a desired current is supplied to the converter. The peak amplitude of the signal $S_F$, which is unfiltered by the RC filter, still carries the information induced by the fault detection inductor, and its peak amplitude can be detected to determine the fault.

Alternatively, the di/dt of the fault current signal is higher than the normal operating current signal, thus a frequency selector could be used to distinguish or separate the two signals.

For instance, the detector may be configured to pass high-frequency signals, and optionally attenuate low-frequency signals, at the feedback inductor to act as the fault feedback signal $S_F$. The filter 150 may be configured to attenuate high-frequency signals, and pass low-frequency signals, at the feedback inductor to act as the current feedback signal $S_C$. In this way, a frequency selector can provides two signals that separately distinguish or represent a (normal) current provided to the output terminals and the occurrence of a fault.

This approach would result in any sudden spikes being filtered from the current feedback signal. Attenuating high-frequency signals may comprise attenuating signals having a frequency more than 1.5 times greater than the frequency of current provided by the converter to the driving circuit, e.g. more than 2 times greater.

The driving circuit may further comprise a second current sensing inductor L6 positioned in the second rectifying path. Like for the first current sensing inductor, the feedback inductor is galvanically isolated from and magnetically coupled to the second current sensing inductor and is configured to modify the current flow through the feedback inductor responsive to the current flow through the second current sensing inductor.

The current sensing circuit 150 is also adapted to sense the current flowing through the second current sensing inductor L6. This approach improves the accuracy of the current sensing performed by the filter 150.

The two currents in the first and second current sensing inductors are rectified and averaged (by the RC filter) and provides the signal $S_C$ as a total current from the converter to the load via the driving circuit. In this way, the current sensing circuit 150 is able to sense the current provided to the output terminals (and/or the output capacitor C1 if present).

During normal operation, the current provided by the converter passes through the first L3 and second L6 (if present) inductors and is reflected on the feedback inductor L7 through magnetic coupling. This produces a filtered signal Vsense that can be detected and used to regulate the load current suppled to the converter, and thereby the load current.

The use of the output capacitor C1 means that the current, resulting directly from the converter, is almost DC or near-DC when passing through the fault feedback inductor L8, this therefore produces negligible impact on the fault feedback signal so that the signal on the inductor L7 is almost the current sense signal from the inductors L3 and L6.

Figure 2:
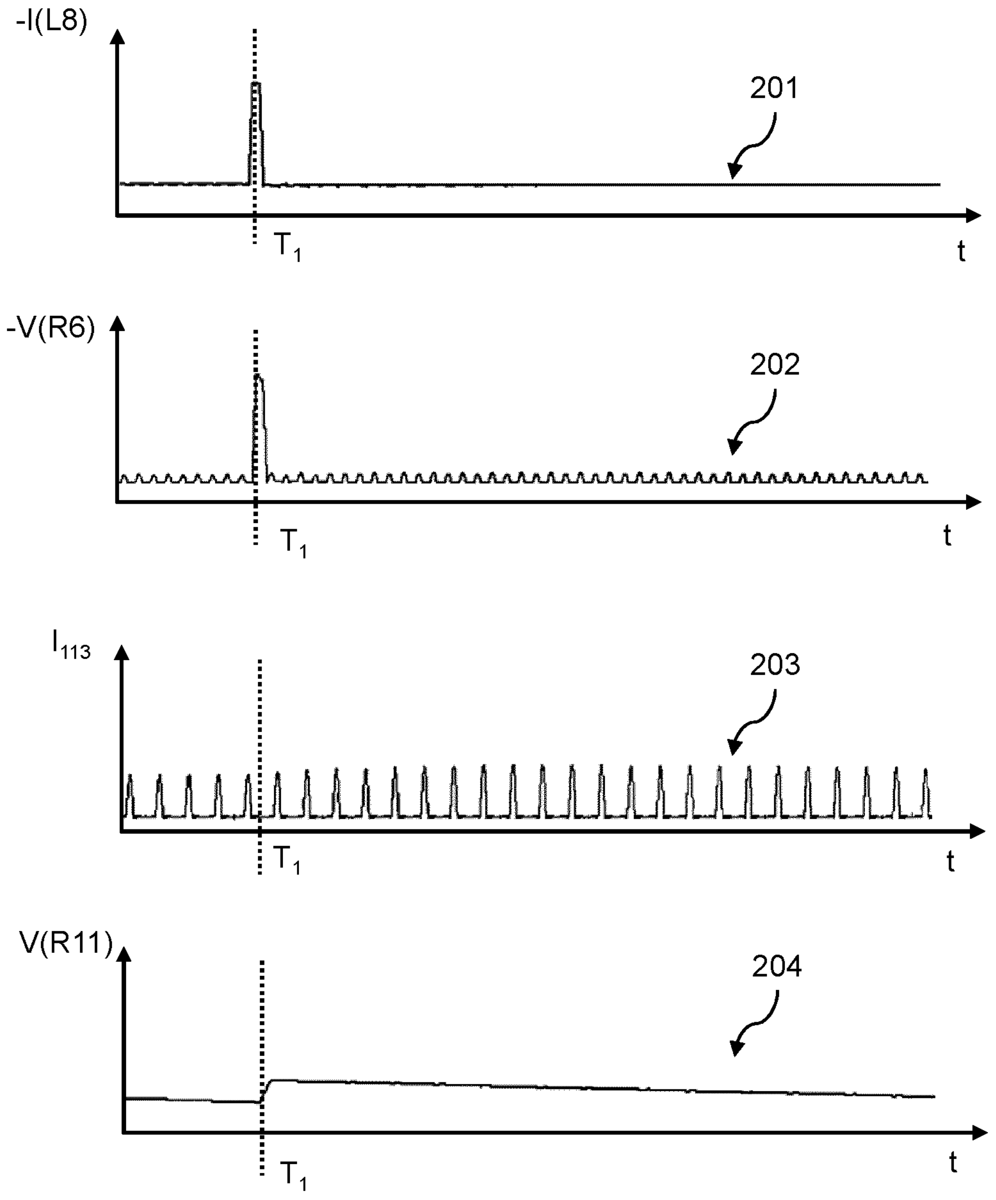
FIG. 2 provides waveforms illustrating an operation of the driving circuit.

FIG. 2 illustrates waveforms at/through various components of the driving circuit, to demonstrate advantages of the proposed driving circuit.

A first waveform 201 illustrates the current –I(L8) through the fault detection inductor, and demonstrates the occurrence of a fault in the load at a time $T_1$. When a fault occurs at the load, there is a spike in the current through the fault detection inductor. In other moments, the current through the fault detection inductor almost constant.

A second waveform 202 illustrates the voltage –V(R6) across the resistive element of the detector R6, which demonstrates a same spike at time $T_1$. The voltage –V(R6) represents the fault feedback signal $S_F$. This peak amplitude/spike is detected and used for fault feedback as mentioned above. In other moments when there is no fault, the voltage on R6 is also smooth. The threshold of the detection can be set at least 150% of the DC offset. This is based on a fact that the current at the output terminal should not vary above 150% of the rated output current, since the output capacitor smooths the current from the converter; if it exceeds 150% of the rated output current, something may go wrong and it is deemed that a fault occurs.

For an improved safety margin, the threshold of the detection may be set to no less than 200% of the DC offset. Those skilled in the art may designate other threshold according to the real case scenario such as the average output current (DC offset), the forward voltage of LEDs, etc. . . .

A third waveform 203 illustrates the current $I_{113}$ through the third terminal 113, representing the current supplied to the output capacitor C1, i.e. a current provided by the converter (which may be rectified by the driving circuit or the converter itself as later described). This demonstrates how the influence of the power supplied to the output terminals is small or negligible on the fault feedback signal compared to a fault between the output terminals. Note that the DC offset on V(R6) and the DC offset on V(R11) depends on this current.

A fourth waveform 204 illustrates the voltage V(R11) across the resistor R11 of the filter 150. The DC offset on V(R11) is mainly used for measuring the current $I_{113}$. This waveform also demonstrates the occurrence of a fault may be detected by the resistor R11, and may therefore be present in the filtered signal Vsense, $S_C$. However, the variation is far smaller than the response of the voltage –V(R6) across the resistive element of the detector R6, for example, an average current would not have a peak variation above 50% of the average current, and is therefore less useful and, in fact, not used to indicate to any potential faults, but is used for current control in normal operation.

It should be noted that FIG. 2 is only for illustrating the relationship between the signals and the switching. In a real use case scenario, the moment the spike on –V(R6) is detected at time $T_1$, the driving circuit may inform the converter to stop operation and there may be no further signals on those components.

Figure 3:
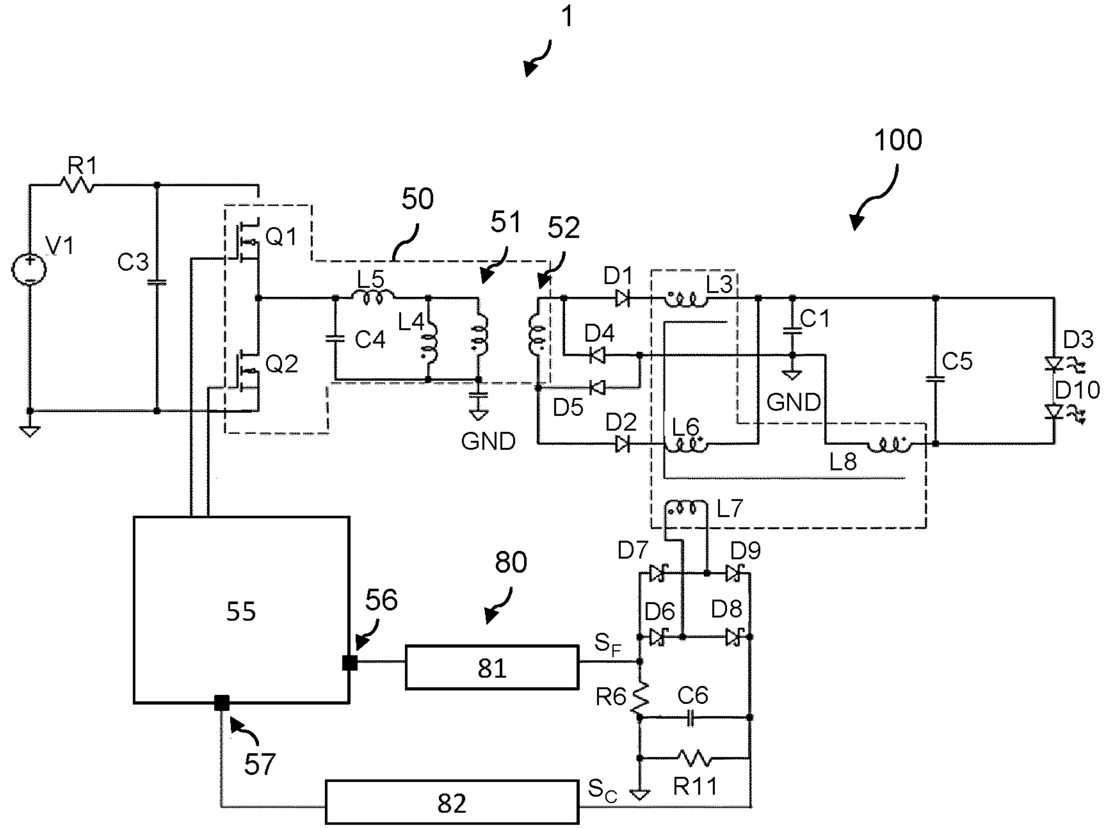
FIG. 3 illustrates a driving arrangement according to an embodiment.

FIG. 3 illustrates a driving arrangement 1 comprising the driving circuit 100 previously described. The driving arrangement 1 may itself form an embodiment.

The driving arrangement 1 also comprises the converter 50 configured to provide power to the driving circuit. The converter 50 converts power provided by a power source or power supply V1, R1, C3 to for providing power to the driving circuit 100. The power source is modelled by a DC power supply, with an output impedance R1. A capacitor C3 is configured to filter out or attenuate any AC components of the DC power supply, thereby acting as a decoupling capacitor. Suitable examples of DC power supplies include batteries, power cells or rectified (and preferably smoothed), even power factor corrected, AC power supplies, e.g. mains supplies.

The illustrated converter 50 is an isolated converter with a primary side winding 51 and a secondary side winding 52 galvanically isolated from and magnetically coupled to the primary side winding 51. The driving circuit 100, and specifically the input 110 of the driving circuit 100, is connected to the secondary side winding.

The converter 50 may comprise an LLC and/or an LCC converting arrangement. Here, the converter comprises an LLC converting arrangement, formed of two inductors L4, L5 and a capacitor C4, as well as a switch network (half bridge) formed of a first switch Q1 and a second switch Q2. The first and second switches may be MOSFETs. The configuration and operation of an LLC converting arrangement is well known to the skilled person, and shall not be described for the sake of brevity. Generally, the LLC converting arrangement converts is configured to supply an alternating power supply (at the second side winding) from a DC power supply, such as an AC-DC converter, or a cell or battery.

The converting arrangement may be replaced by any other suitable converting arrangement, which may depend upon the nature of the power supply. One example is a buck/boost/buck-boost converter for converting an AC power supply, e.g. a mains supply, to an AC current for the first winding. Other examples would be apparent to the skilled person.

The driving arrangement 1 may also comprise a controller 55. The controller is configured to control the power provided to the driving circuit via the second winding responsive to at least the fault feedback signal $S_F$. More particularly, the controller 55 may control the operation of the switch network, to thereby control the operation of the LLC converting arrangement.

In some examples, the controller is configured to make the driving arrangement enter a protection mode, in which no power is supplied to the driving circuit, responsive to the fault feedback signal indicating that there is the fault. The protection mode may, for instance, be performed by maintaining the first switch Q1 open, so that no current flows through the first winding 51. Other approaches for entering a protection mode would be apparent to the skilled person.

A fault feedback signal may indicate the presence of a fault if a voltage of the fault feedback signal exceeds some predetermined value, indicating a current spike between the output terminals. The predetermined value may be a value no less than 150%, e.g., no less than 200%, of the value of the fault feedback signal when no fault occurs, e.g. the DC offset of the fault feedback signal.

In one example, the fault feedback signal may indicate the presence of a fault if a voltage of the fault feedback signal indicates that a current through the resistive element of the detector R6 exceeds a value a predetermined number of times greater (e.g., 1.5 times, 2 times greater, 5 times greater or 10 times greater) than a peak current when no fault occurs, e.g. during normal operation. Referring to FIG. 2, normal operation is represented by ripples in the voltage across the detector R6.

In another example, a fault feedback signal may indicate the presence of a fault if a gradient of a fault feedback signal exceeds some predetermined gradient value, indicating the occurrence of a current spike between the output terminals. The predetermined gradient value may be no less than 150%, e.g., no less than 200%, of the maximum gradient of the fault feedback signal when no fault occurs, e.g. a gradient induced in the fault feedback signal by the normal operation of the converter.

The controller 55 may be configured to process the fault feedback signal to identify the presence or occurrence of a fault. Thus, the controller 55 may compare the fault feedback signal to one or more predetermined thresholds or ranges to determine or predict whether the fault feedback signal indicates the presence of absence of a fault.

In some examples, the controller may be configured to make the driving arrangement operate in a drive mode, and regulate the power supplied to the driving circuit responsive to the current feedback signal. The controller may be configured to operate in the drive mode when no fault has yet been identified by the fault feedback system (e.g. since start-up) and/or a predetermined period of time has elapsed since a last fault was identified by the fault feedback system and/or responsive to a user input.

Thus, the controller 55 may receive a user input, e.g. from a user interface system such as a button or other communication device, and configure the controller to operate in the drive mode. Of course, a user input may also/otherwise be used to define other properties of the controller, such as a reference current, a power supplied to the converter, a mode of operation and so on.

In some examples, when operating in the drive mode, the controller is configured to regulate the current provided to the driving circuit to meet a reference current by monitoring the current feedback signal with respect to a target. Approaches for defining a suitable reference current will be readily apparent to the skilled person, e.g. employing voltage dividers or the like.

The controller 55 may receive the current feedback signal and the fault feedback signal via different input pins, as shown by FIG. 3. For instance, the fault feedback signals $S_F$ may be received at a first input pin 56, and the current feedback signal $S_C$ may be received at a second input pin 57.

The driving arrangement 1 may comprise an amplifier arrangement 80. The amplifier arrangement is configured to amplify the fault feedback signal $S_F$ and, if present, the current feedback signal $S_C$. The amplifier arrangement 80 may comprise a first amplifier 81 for amplifying the fault feedback signal $S_F$ and a second amplifier 82 for amplifying the current feedback signal $S_C$.

Reference to a fault feedback signal and/or a current feedback signal may refer to an amplified version of the respective signals. For instance, the first input pin 56 may receive an amplified or non-amplified version of the fault feedback signal $S_F$, and the second input pin 56 may receive an amplified or non-amplified version of the current feedback signal $S_C$.

In the above embodiments, the first current sensing inductor is in a rectifying path of a rectifier. This embodiment does not limit the scope of the claims. In other embodiments with or without the rectifier, the first sensing inductor can be put anywhere that the operating current, provided to the load, flows, such that the first sensing inductor senses the operating current.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage. If the term "adapted to" is used in the claims or description, it is noted the term "adapted to" is intended to be equivalent to the term "configured to". If the term "arrangement" is used in the claims or description, it is noted the term "arrangement" is intended to be equivalent to the term "system", and vice versa. Any reference signs in the claims should not be construed as limiting the scope.

The invention claimed is:

1. A driving circuit for providing power generated by a converter to a load, the driving circuit comprising:

an input adapted to receive power from the converter;

output terminals adapted to connect to the load for providing the received power to the load;

a fault detection inductor electrically connected in series with the output terminals so that a current flow through the output terminals and the load passes through the fault detection inductor, such that a fault across the output terminals causes a change in the current flow through the fault detection inductor;

a first current sensing inductor through which a current provided by the converter passes;

a second current sensing inductor through which a current provided by the converter passes;

a feedback inductor galvanically isolated from and magnetically coupled to the fault detection inductor and configured to modify an electrical parameter through the feedback inductor responsive to the change in the current flow through the fault detection inductor, the feedback inductor galvanically isolated from and magnetically coupled to the first current sensing inductor and is configured to modify an electrical signal through the feedback inductor responsive to the current flow through the first current sensing inductor via the electrical signal, and the feedback inductor galvanically isolated from and magnetically coupled to the second current sensing inductor and is configured to modify the electrical signal through the feedback inductor responsive to the current flow through the second current sensing inductor via the electrical signal;

a detector configured to detect the modification in the electrical parameter through the feedback inductor and generate a fault feedback signal responsive to the detected modified electrical parameter; and a current sensing circuit to sense current flowing through the first current sensing inductor and the second current sensing inductor via the electrical signal.

2. The driving circuit of claim 1, further comprising an output capacitor connected in parallel with the output terminals and adapted to smooth the received power from the converter, wherein the fault detection inductor is electrically connected between the output capacitor and the output terminals.

3. The driving circuit of claim 1, further comprising:

a rectifier arrangement configured to rectify power provided by the converter and provide the rectified power to the output terminals, wherein the rectifier arrangement comprises a first rectifying path;

and the first current sensing inductor is positioned in the first rectifying path;

wherein the current sensing circuit further comprises a filter configured to generate a filtered signal, being a filtered version of the current flow through the feedback inductor relating to the current flow through the first current sensing inductor and in which a current component induced by the fault detection inductor is filtered or attenuated.

4. The driving circuit of claim 3, wherein the filter may be any one of:

an averaging circuit; and a frequency selecting circuit;

the rectifier arrangement comprises a second rectifying path, and the driving circuit further comprising:

the second current sensing inductor positioned in the second rectifying path;

wherein the current sensing circuit comprises a rectifying circuit coupled between the feedback inductor and the filter.

5. The driving circuit of any of claim 1, wherein the fault comprises any one of: a short circuit, an open circuit, or a loose connection of the output terminals and/or the load.

6. The driving circuit of claim 1, further comprising a signal processing circuit configured to process the fault feedback signal to determine the presence or absence of the fault.

7. The driving circuit of claim 6, wherein the feedback inductor is configured to modify the electrical parameter responsive to a current flow through the fault detection inductor greater than 150% of a rated normal output current of the driving circuit.

8. The driving circuit of claim 1, wherein the detector comprises a resistive element connected between a positive terminal of the feedback inductor and a ground or reference voltage.

9. A driving arrangement comprising:

the driving circuit according to claim 1; and the converter configured to provide power to the driving circuit.

10. The driving arrangement of claim 9, wherein the converter is an isolated converter with a primary side winding and a secondary side winding galvanically isolated from and magnetically coupled to the primary side winding, wherein the driving circuit is connected to the secondary side winding.

11. The driving arrangement of claim 9, wherein the converter comprises an LLC and/or an LCC converting arrangement.

12. The driving arrangement of claim 9, wherein the converter comprises a controller electrically connected to the primary side winding and the feedback winding, and configured to control the power provided to the driving circuit via the second winding responsive to at least the fault feedback signal.

13. The driving arrangement of claim 12, wherein the controller is configured to make the driving arrangement enter a protection mode, in which no power is supplied to the driving circuit, responsive to the fault feedback signal indicating that there is the fault.

14. The driving arrangement of claim 12, wherein the controller is configured to make the driving arrangement operate in a drive mode, and regulate the power supplied to the driving circuit responsive to the current feedback signal.

15. The driving arrangement of claim 14, wherein, when operating in the drive mode, the controller is configured to regulate the current provided to the driving circuit to meet a reference current by monitoring the current feedback signal with respect to a target.

16. A driving circuit for providing power generated by a converter to a load, the driving circuit comprising:

an input adapted to receive power from the converter;

output terminals adapted to connect to a load for providing the received power to the load;

a fault detection inductor electrically connected in series with the output terminals so that a current flow through the output terminals and the load passes through the fault detection inductor, such that a fault across the output terminals causes a change in the current flow through the fault detection inductor;

a first current sensing inductor through which a current provided by the converter passes;

a feedback inductor galvanically isolated from and magnetically coupled to the fault detection inductor and configured to modify an electrical parameter through the feedback inductor responsive to the change in the current flow through the fault detection inductor, and also galvanically isolated from and magnetically coupled to the first current sensing inductor and is configured to modify an electrical signal through the feedback inductor responsive to the current flow through the first current sensing inductor via the electrical signal;

a detector configured to detect the modification in the electrical parameter through the feedback inductor and generate a fault feedback signal responsive to the detected modified electrical parameter; and a current sensing circuit to sense current flowing through the first current sensing inductor via the electrical signal;

wherein the converter is configured to provide power to the driving circuit; and wherein the converter comprises a controller electrically connected to the primary side winding and the feedback winding, and configured to control the power provided to the driving circuit via the second winding responsive to at least the fault feedback signal.

17. The driving arrangement of claim 16, wherein the controller is configured to make the driving arrangement enter a protection mode, in which no power is supplied to the driving circuit, responsive to the fault feedback signal indicating that there is the fault.

18. The driving arrangement of claim 16, wherein the controller is configured to make the driving arrangement operate in a drive mode, and regulate the power supplied to the driving circuit responsive to the current feedback signal.

19. The driving arrangement of claim 16, wherein, when operating in the drive mode, the controller is configured to regulate the current provided to the driving circuit to meet a reference current by monitoring the current feedback signal with respect to a target.

* * * * *